United States Patent [19]

Fellhauer et al.

[11] Patent Number: 4,488,299
[45] Date of Patent: Dec. 11, 1984

[54] COMPUTERIZED VERSATILE AND MODULAR TEST SYSTEM FOR ELECTRICAL CIRCUITS

[75] Inventors: Michael Fellhauer, Geislingen; Otto Holzinger, Eschenbach; Klaus Vits, Uhingen-Baiereck; Bert Wurst, Möglingen, all of Fed. Rep. of Germany

[73] Assignee: Robert Bosch GmbH, Stuttgart, Fed. Rep. of Germany

[21] Appl. No.: 367,915

[22] Filed: Apr. 13, 1982

[30] Foreign Application Priority Data

Apr. 23, 1981 [DE] Fed. Rep. of Germany ....... 3116079

[51] Int. Cl.³ .............................................. G06F 11/00
[52] U.S. Cl. ................... 371/20; 324/73 AT; 324/73 R
[58] Field of Search .......... 371/20; 324/73 AT, 73 R, 324/73 PC

[56] References Cited

U.S. PATENT DOCUMENTS

| | | | |
|---|---|---|---|
| 4,044,244 | 8/1977 | Foreman et al. | 324/73 R |
| 4,055,801 | 10/1977 | Pike et al. | 371/20 |
| 4,168,796 | 9/1979 | Fulks et al. | 371/20 |
| 4,291,404 | 9/1981 | Steiner | 371/20 |
| 4,393,498 | 7/1983 | Jackson et al. | 371/20 |
| 4,397,021 | 8/1983 | Lloyd et al. | 371/20 |
| 4,402,055 | 8/1983 | Lloyd et al. | 371/20 |

*Primary Examiner*—Jerry Smith
*Assistant Examiner*—Mark Ungerman
*Attorney, Agent, or Firm*—Frishauf, Holtz, Goodman & Woodward

[57] ABSTRACT

An address and data bus connects a multiplicity of ports into which test modules can be inserted with a microcomputer controlled by a keyboard for performing tests on circuit boards or other electronic units through test plugs that are interconnected with the data ports where the test modules are plugged in. When the test system is put into operation, all of the ports of the data bus are addressed to produce an indication of which ports are occupied by test modules as well as of the nature of the test modules. When it is desired to produce a test, each step of the procedure is performed by operation of a keyboard with reference to available options presented on the computer display on the basis of the configuration of test modules that have been plugged in. Coupling fields are interposed between data ports designed to receive test modules utilizing analog circuits and a test connector for connection to equipment under test. A coupling field has its own data port to enable switching the connection between the test module and the test plug to perform various tests under computer keyboard control. A wide variety of tests can be set up simply by manipulating the keyboard of the computer and the versatility of the system is still further increased by the possibility of plugging in the various kinds of test modules at different data ports and by interchanging the read-only memories of the microcomputer.

9 Claims, 3 Drawing Figures

COMPUTERIZED VERSATILE AND MODULAR TEST SYSTEM FOR ELECTRICAL CIRCUITS

This invention concerns a test system for electrical components and assemblies equipped with a connector through which tests can be made, for example, circuit boards that can be removed from an electrical apparatus for test, servicing or replacement.

Known test systems in this class, in addition to being equipped with connectors for making the necessary connections to the circuit to be tested, include a current supply for the test equipment and sockets or bases into which subassemblies or modules equipped with measuring and testing devices can be mounted, by plugging them in, to perform the testing of the circuit boards or subassemblies which the particular plug-in circuit is designed to test. Such plug-in test circuits are referred to herein as "modules" of the test system.

In the known devices the test modules fit into a corresponding socket connector of the casing of the test system and the various socket connectors for receiving test modules that may be used are connected to each other by data connections. One of the sockets is often designed for receiving a computer unit. In such case the computer can usually be programmed by means of a keyboard utilizing one of the known programming languages, so that other test modules which are inserted into the test system may be caused to carry out the corresponding commands.

Further details of known test systems of the kind just described can be found, for example, in prospectus bulletin 6942A issued by Hewlett Packard in July 1980. If a particular circuit board or subassembly is to be tested, it is necessary that the appropriate test modules should previously be inserted into the test system. Furthermore, in this connection it must also be checked that the particular modules are correctly inserted, since certain modules usually may be properly inserted only in particular locations of the the test system. For the handling and operating of such a test system persons having a command of the particular programming language used are required as operators. If the apparatus is misprogrammed, the result may be damage of the equipment under test or the failure of the test system to operate at all. A further disadvantage is that special wiring must be incorporated for every application of the test system, more particularly, from the corresponding connection plugs of the test system circuit board, cables for connection to the device under test must be provided. This cabling is to be newly fitted for every kind of test. The known test systems thus have the disadvantage that they are expensive to operate and involve some risk of damaging the equipment under test if improperly handled. The time required to convert the test system undesirably long.

THE INVENTION

It is an object of the present invention to provide a test system that is versatile, i.e. that is ready with a few simple steps, the effectiveness of which is instantly checkable, to perform any test in its reportory.

Briefly, the test system's microcomputer, which includes a microprocessor, a memory, a keyboard and a test display which may be a viewing screen or a printout, or both, is provided with a two-way input/output data bus having input/output ports for the various test modules which can be plugged into the ports. Each port has an addressable decoder-encoder for reporting at least whether a module is plugged in there. Connectors for connecting up with the units to be tested are cabled to the appropriate ports and one connector can be used for testing a variety of units, requiring only that the proper test modules be plugged into the ports to which the connector is wired.

For the performance of tests with modules utilizing measuring or testing circuits of an analog rather than a digital type, it is useful to provide coupling field units having their own data ports through which units the analog circuit test modules are wired through their own sockets for communicating, through the coupling field, to the equipment under test. The coupling fields can be programmed, then, by the microprocessor through the data port of the coupling field.

In the system of the invention, when the testing system is switched into operation, the start-up program of the microcomputer can quickly address all the data ports in turn, to provide an initial display showing what test modules are plugged in, at the same time verifying their readiness for operation. The decoder-encoders of the data ports report, when the port is initially addressed, the identity of the test module and its readiness or nonreadiness to operate (i.e. by a preliminary test of the test module).

The programming of the microcomputer can then conveniently indicate, automatically, what kinds of tests can be made with the modules found to be in place in the system, presenting this information as a "menu" from which the test operator is invited to selected a particular kind of test. When the test selection has been made, then the microcomputer can be made to invite the connection of a unit to be tested, and, after verifying that a proper kind of unit has been connected for test to the appropriate test connector, can either invite a test to be made, if there is any selection of procedure to be ordered, or else immediately proceed to make the test.

If a sequence of tests is to be made, that can be made automatically, or if a selection is to be made at any stage, the selection can be invited, so that in any event the operation of the test procedure requires no knowledge of program languages by the operator and requires no time consuming and skill-requiring efforts to terminate one series of tests and initiate another series of tests of a different kind on a different kind of component.

The invention has the advantage that the test modules can be disposed at various different locations in the test system as may be required for leading the desired test leads through a particular one of the set of test connectors and the proper disposition of the plug-in test modules can be readily verified by automatic display as soon as they are plugged in.

The use of a coupling field to which an array of test modules are connectable has the advantage that the inputs and outputs of the various test modules can be switched in a wide variety of ways to the equipment under test by computer command of the coupling field. This makes it unnecessary to put extra control circuits in the test module itself. The test module may be used in a number of different data ports for different purposes, operating through different coupling fields. Thus the inputs and outputs of the various test modules can be switched to external circuits in practically any desirable manner. For this purpose it is desirable for the coupling field to be made programmable by the microcomputer through its own data port. The coupling field may share its connection member for connection with the unit under test with one or more data ports which receive test modules that do not need to operate through a programmable coupling field. In such case, the latter modules have the benefit of short direct connections, which are desirable for critical signals which would be subject to disturbance if the path is too long.

The provision of a display greatly facilitates the reliability and rapidity of communication between the operator and the test system. The use of a keyboard commanding the various data ports through a micocomputer saves a great deal of changing of fixed wiring.

It is particularly useful to provide the deactivation of the keys of the keyboard which at any particular time cannot provide a meaningful command or interrogation, thus preventing malfunctions. It is further advantageous to provide a warning signal when a thus deactivated key is actuated, advising the operator that a misactuation has occurred and that he must repeat the intended actuation correctly if he expects to have the intended result.

The control of all these functions centrally by a microcomputer makes a testing system of this kind particularly economical.

The information which is not expected to be changed in the use of the computer is preferably stored in a read-only memory. In this way the microcomputer can be enabled to block the operation of certain keys of the keyboard and to indicate at any stage the various possible commands that are available for execution by display on the display device, which is preferably a cathode may tube screen. The read-only memory, however, is preferably arranged so that it is interchangeable with replacement units for use with information coded in different coding, or in terms of a different set of units, and likewise when it is desired to adapt the test to new technologies incorporated in test modules or in equipment to be tested.

It is also desirable that the test modules should themselves be checked out when the equipment is put into operation so that the operator can be assured that they are ready to function. This readiness can be indicated by a single data bit added to the identification word of the module. An error in the operation of the test module can thereby be made promptly recognizable before there is any risk of damage to the equipment under test.

It is advantageous in addressing each test module in turn to indicate on the display the properties, the disposition of the input and/or output connections, the manner of operation and the operating range and parts thereof. This facilitates proper use of the system and avoids damage to the test modules or the equipment under test. The operator of the system is automatically advised of the essential data of the test module. If various data can provided or adjusted in one or more ranges, it is advantageous to indicate the choice available and to have the operator select by operating the keyboard.

THE DRAWINGS

The invention is further described by way of illustrative example with reference to the annexed drawings in which.

DESCRIPTION OF THE ILLUSTRATED EMBODIMENT

Figure 1:
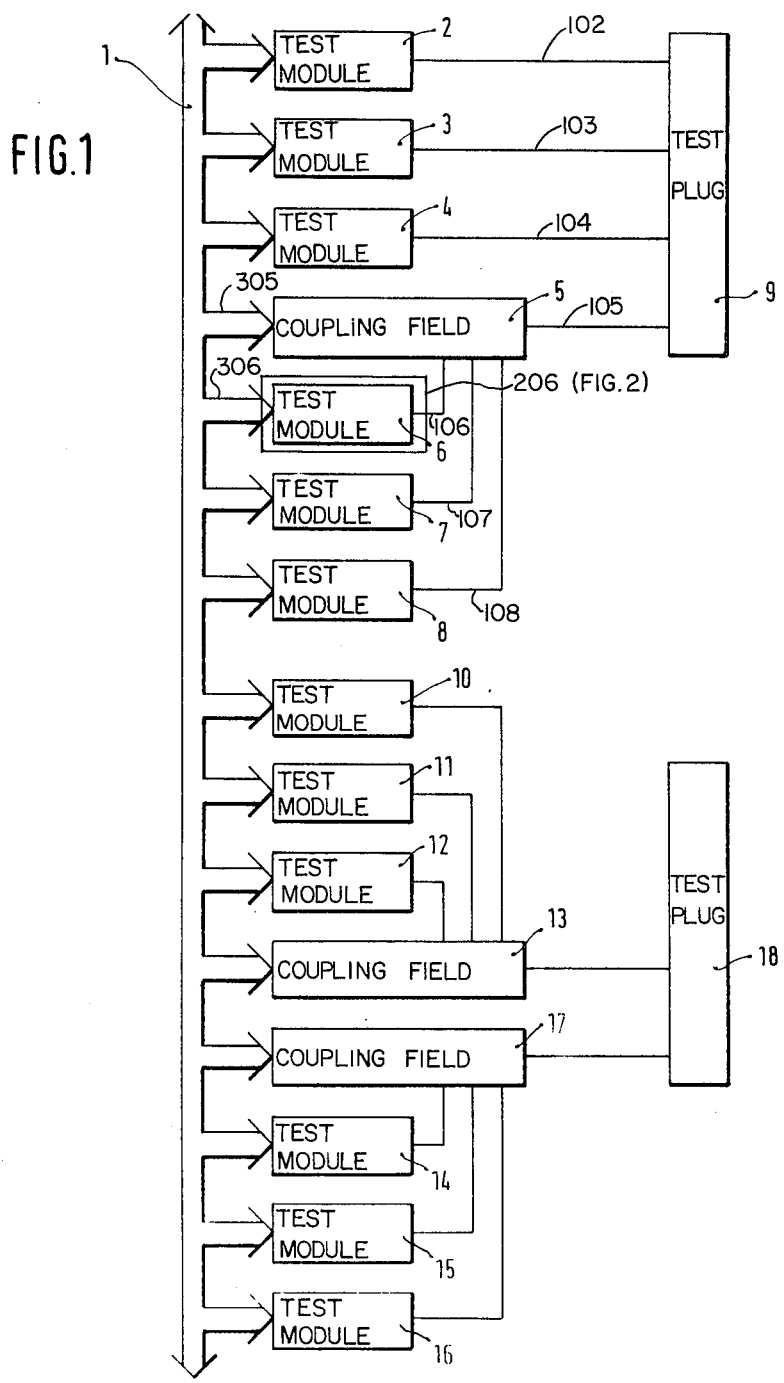
FIG. 1 is a block diagram of the data bus of a test system in accordance with the invention, test modules, coupling fields and test connectors.
Figure 2:
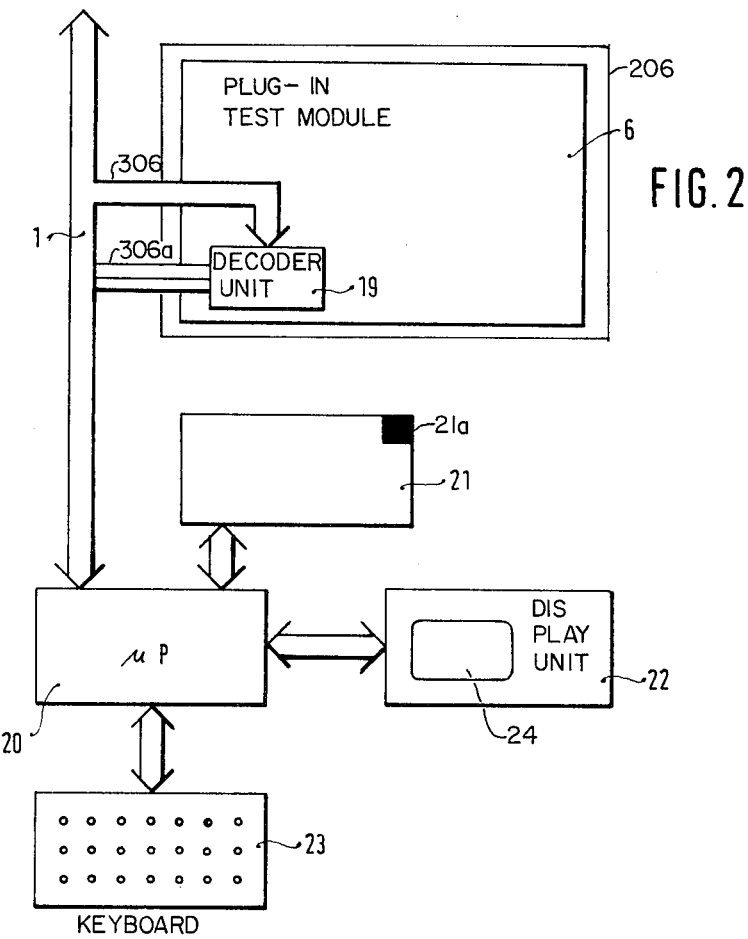
FIG. 2 is a block diagram of the remainder of the test system including a more detailed block diagram of a data port and a test module.

In FIG. 1 the data bus 1 is to be understood to be connected to a microprocessor of a microcomputer in the manner illustrated in FIG. 2. To the right of the data bus are illustrative branches leading to data ports which accept through plug connectors test modules and coupling fields represented by rectangles. Thus, the data port 202 for the test module 2 is equipped with a socket (not shown) into which the test module 2 may be plugged. In the drawing it is assumed that all the test modules are plugged into an appropriate socket of the data port. The data port socket may have a connection such as the connection 102 to a test connector which is to be plugged into a unit that is to be subjected to a test. The connection 102 is symbolic and may involve several conductors rather than a single conductor. The data bus port 202 is shown for the case of the test module 2, but for simplification of the drawings the data port providing the receptacle for plugging in the test module is not separately shown for the other test modules.

The test modules 2, 3 and 4 are of a kind that can be directly connected on the one hand to the data bus 1 and on the other hand through the symbolic connection 102, 103 or 104 to the test plug 9.

The test modules 6, 7 and 8, however, are test modules utilizing analog circuits for measurement or test and their connections to the test plug 9 pass through the coupling field 5, which has its own data port served by the data bus branch 305. The test modules 7 and 8 are likewise test modules utilizing analog circuits and they are connected to the test plug 9 through the connections 105 of the coupling field 5, the test modules 7 and 8 being respectively connected to the coupling field 5 by the connections 107 and 108. The connection 106, 107 and 108 may likewise be made up of a plurality conductors.

The bus 1 is referred to as a data bus for short. It actually serves both as an address bus and a data bus and tramsmits multibit addresses for recognition at the corresponding ports, while also transmitting data in both directions between the microprocessor 20 FIG. 2) and the various ports. In FIG. 1 are additional test modules 10, 11 and 12, associated with a coupling field 13 and test modules 14, 15 and 16 associated with a coupling field 17, these two coupling fields having connections with the test plug 18.

FIG. 2 shows the rest of the system, namely the microprocessor 20, its memory 21, the display 22 and the keyboard 23. FIG. 2 also shows just one of the data ports and its test module, in this case the test module 6, as will be further described below.

The test system itself consists of a multiplicity of measuring and stimulus generating apparatus necessary for testing and checking equipment that may be connected, in some cases, with the test plug 9 and in certain other cases with the test plug 18. FIG. 1 shows the data bus continuing at the top as well as at the bottom of the figure, which signifies that still more data ports may be provided, with additional emplacements for test modules and additional coupling fields, as well as additional test plugs. Thus, a wide variety of electrical circuit boards or other subassemblies, complete equipments or individual components can be tested. As measuring apparatus in the test modules, for example, there may be provided voltage or current measuring devices, frequency counters or ohmmeters. Some test modules may include as stimulus generating devices, for example, sine wave or rectangular wave generators, ramp generators, level converters or pulse generators. The number and kinds of modules will depend upon the testing tasks which the test system is to perform. The test equipment, whether measuring or stimulating, or both, is built into modules which can be inserted in a variety of places provided at the various data ports. Their interfaces with the data port are constituted identically in both mechanical and electrical respects so that they can be placed at any of a number of data ports, so that any suitable configuration of test modules can be constituted for interchanging information and test data over the bus which serves for address and data purposes. As explained already, the modules can be equipped with digital or analog test circuits and their outputs may be supplied by the data port either directly to a test plug or through a coupling field such as one of the coupling fields 5, 13 and 17. The nature of the connection to the test plug and the circuitry in the coupling field when a coupling field is used depends on the particular test to be performed. If a particular group of plug contacts of a test module is always to be connected to the same prongs of the test plug 9 or 18, a direct connection from the data port to the test plug as illustrated by the connections 102, 103 and 104, is advantageous. Such a connection is particularly suitable for current supply to equipment under test for digital signals. If however, a test module needs to have a variety of different connections to external equipment under test, then the interposition of a coupling field such as one of the fields 5, 13 or 17 is advantageous. All input and output connections of the modules 6, 7 and 8 are then made available to the coupling field 5, and the connection 105 represents that several connections are made from the coupling field 5 to various free connection prongs of the test plug 9.

It is to be understood that within the coupling field 5 means are provided for connecting every signal, input or output, of the test module 6, 7 and 8 to any one of a number of contacts of the test plug 9, as may be commanded by the microprocessor 20 over the address and data bus 1. Thus the test plug 9 is immediately adaptable to every new measurement task without requiring any troublesome rewiring. Since the coupling field 5 operates similarly to a crosspoint distributor switch controllable over the address and data bus 1, the control of the steps of the test procedure is fully performed by means of the computer illustrated in FIG. 2. The test system can thus at any time be fitted to new test requirements.

As already mentioned, FIG. 2 shows only one of the test modules, the test module 6 in the port 206. As shown in FIG. 2 the test module 6 has a decoder unit 19 which is addressed by the branch bus 306 and responds to its address and may also furnish data received by connections to the test module 6 which are not shown, through a portion of the branch bus 306 which is separately shown in FIG. 2 as the branch bus 306a. The connections of the port 206 to the coupling field 5, as well as the circuits of the test module 6 connected to the decoder unit 19 and to the port 206 for connection to the coupling field 5, are omitted in FIG. 2, since they would depend on the particular type of test that the test module 6 is intended to perform.

The components of the microcomputer, namely the microprocessor 20, the memory 21, the keyboard 23 and the display 22, have already been mentioned. The black square 21a in one corner of the memory 21 indicates that a portion of this memory is a fixed memory (read-only memory) which is preferably interchangeably insertable in the memory unit 21 so that different fixed memories can be provided if desired.

OPERATION

When the system is put into service, the microprocessor 20 first transmits all the addresses one after another each data port of the bus 1 having an individual address. The data port 206 contains a decoder 19 which is activated by reception of the address of the port, which in response provides a data word on the basis of which the microprocessor 20 can recognize that this port is occupied by a test module. Some bits of this word may, by connections not shown in FIG. 2 but provided between the decoder 19 of the port 206 and the internal circuitry of the plug-in test module 6, what kind of a test module is inserted there. In response to the addressing of the port the module 6 can be constituted to be activated by the decoder 19 to perform a readiness test and to provide a logic 1 bit at one bit position of the data word indicating readiness, or a logic 0 bit in its place if the test module is not completely capable of operation.

The number of address and data bits necessary of course depends upon the number of ports of the test system for addresses and the number of different kinds of modules and the variety of data reportable with regard to responses. The transmission of data can be done in parallel or in series, with parallel transmission of the bits of each word having the advantage of more rapid transmission. The data obtained from the ports of the bus 1 are stored in the memory 21 by the microprocessor 20, in the main portion thereof which is random access memory (RAM) in order to serve for the control of the test system.

Control commands are put into the system by the keyboard 23 that supplies signals to the microprocessor 20. They may also be displayed on the display unit 22, either on a picture screen 22 as illustrated or if desired by a print-out. By the coding provided in the computer the keys of the keyboard are allocated control of the functions required at the particular time in the operation of the test modules.

Figure 3:
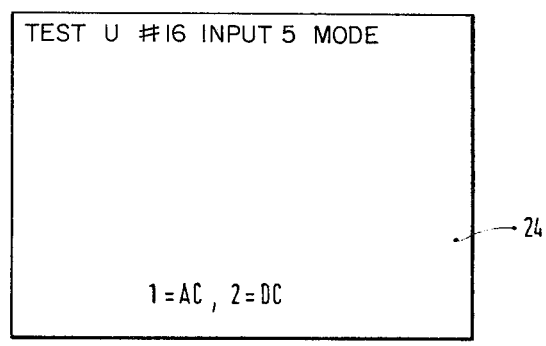
FIG. 3 is an illustration of one form of a display at a certain stage of a test.

FIG. 3 shows an example. If the test system is in the quiescent state after having been switched on, there will be shown what functions are programmable by means of the test modules that are in place. If now, for example, it should be selected by pressure on a key that a measurement is to be performed, the word "test" will appear on the picture screen 22. If now by operation of the particular key a voltage test is chosen, a U (for voltage measurement) appears on the picture screen 24 of the display 22 at the upper left. Next there must be designated at which port the test module has been put in place that is capable of making a voltage measurement. In the illustrated case this is the port 16. This number is then shown following a symbol indicating port number. The next number to be registered is which plug contact of the test plug 9 or the test plug 18 is to be occupied with the measurement input. In the illustrated case this is indicated by the number 5 following the label "input". It will be seen that the utilization of the particular prong of the test connector is variable by means of the keyboard 23 operating through a coupling field 5, 13 or 17.

After the above commands have been registered, there appears at the bottom of the picture screen which magnitudes are yet to be selected. As shown in FIG. 3 at the bottom, if the number 1 is now keyed in that will mean that an alternating current measurement will take place, whereas if the number 2 is put in, what will result is a dc measurement. At this stage, no other keys of the keyboard 23 can be activated except the keys of the digits 1 and 2. If in spite of that fact, one of the other keys is activated, they produce no command to the microprocessor 20, but instead a signal sounds that shows that a false key has been actuated. As a further magnitude, the voltage range could now be selectable, insofar as this adjustment does not automatically follow.

The information constantly necessary for the computer is stored in the portion of the memory 21 that is constituted as a read-only memory, preferably an interchangeable one. In this fixed value storage for display on the picture screen at the appropriate moment in order to simplify the operation of the test system. Thus, for example, in the situation of FIG. 3 there could be provided in the middle of the picture screen "select type of voltage for test:".

The operation of the system for making a test on a component by selecting the kind of test, the type of voltage applied and the terminals of the test plug through which the test on the equipment to be tested is to be made has already been discussed. If a series of identical circuit boards are to be tested in the same manner, it is advantageous to store the selections made for the test of the first one, so that the remaining tests of the series can be made by making all these selections automatic until the series is complete. For example, after one test has been completed the display may ask the operator whether the test procedure is to be put in memory for repetition of the test on the same or on another sample or whether the procedure should be erased. If memorizing is then selected by actuation of the key indicated therefor on the display, the operator may be asked whether he wants its stored in a temporary memory identified by a small number or whether he wants to give the procedure a name by which it can be retrieved over a long period from more permanent storage in the memory. Such operations are typical in modern computer technology and the details of their implementation by means of a microprocessor equipped with a keyboard and random access and read-only memories, as well as a display, requires no further explanation.

The interchangeability of the read-only memory 21a is useful not only for changing a mode of operation of one or more tests, but also for substituting a different language for the text material of instructions.

Although the invention has been described with reference to a particular illustrative embodiment, it will be recognized that modification and variations are possible within the inventive concept.

We claim:

1. A versatile testing system for electrical components and circuits which are in each case accessible by a multiple-contact test connection member, comprising:
    at least one multiple-contact test plug capable of mating said multiple-contact connection members of said components and circuits to be tested;
    a two-way data and address bus having a plurality of data and address ports, said ports having connection places for plug-in connection,
    a microcomputer equipped with a microprocessor, a memory, a keyboard for making test selections and orders and a display unit said microcomputer being connected to said bus and constituted for selectively addressing the several ports of said bus for producing tests and registering the results thereof on said display in response to orders entered from said keyboard, for presenting on said display available options for further orders for completion of a selected test, for indicating an aborted test in response to an order from said keyboard not within said available options, and for addressing all ports of said bus in quick succession in order to display whether test modules are connected to the several ports and if so which modules are so connected;
    a set of test modules selectively connectable at connection places to said ports, each of which modules is provided with a coding circuit addressable through a said port of said bus into which it is connectable, for supplying a data word to said microcomputer identifying the nature of the test module, its presence at the said port and its ready-or-not condition, and
    connection means at ports of said bus for connecting said at least one test plug directly or indirectly to places at said ports where a plurality of said test modules are respectively connectable,
    said microcomputer being also constituted to scan said ports of said bus and to display an indication of test modules connected thereto and of the state of said modules.

2. A versatile testing system as defined in claim 1, in which said connection means includes a coupling field connected to an additional port of said bus for providing indirect connections between said bus and said test plug, comprising interface circuitry between at least one test module utilizing analog measurement circuitry and said test plug.

3. A versatile testing system as defined in claim 2, in which a plurality of said ports are provided for accepting only test modules incorporating test circuitry directly connectable to components or circuits to be tested through a said test plug, and in which a plurality of said ports are also provided for accepting only test modules which include analog circuitry requiring said coupling field for controlling connections between said analog circuitry modules and a said test plug.

4. A versatile testing system as defined in claim 2 or 3, in which said microcomputer is constituted also for programming a said coupling field for conducting a test by means of test modules connected thereto which include said analog circuitry.

5. A versatile testing system as defined in claim 1, in which means are provided in said microcomputer for blocking the operation of said keyboard in response to an order from said keyboard not within said available options.

6. A versatile testing system as defined in claim 1, in which said memory of said microcomputer includes a read-only memory in which port addresses, test module identities, test module functions and displayable indications are stored.

7. A versatile testing system as defined in claim 6, in which said read-only memory is replaceable by at least one other read-only memory interchangeable therewith which is provided as an availale part of the testing system.

8. A versatile testing system as defined in claim 1, in which said microcomputer is constituted to test all the test modules connected to said ports as soon as the testing system is put into operation.

9. A versatile testing system as defined in claim 8, in which said microcomputer is constituted to provide displays of the results of the tests of said test modules made when the testing system is started into operation.

* * * * *